(12) United States Patent
Cai et al.

(10) Patent No.: US 8,361,872 B2
(45) Date of Patent: Jan. 29, 2013

(54) HIGH PERFORMANCE LOW POWER BULK FET DEVICE AND METHOD OF MANUFACTURE

(75) Inventors: Jin Cai, Cortlandt Manor, NY (US); Toshiharu Furukawa, Essex Junction, VT (US); Robert R. Robison, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 32 days.

(21) Appl. No.: 12/876,480

(22) Filed: Sep. 7, 2010

(65) Prior Publication Data

US 2012/0056275 A1  Mar. 8, 2012

(51) Int. Cl.
*H01L 21/336* (2006.01)
*H01L 29/02* (2006.01)

(52) U.S. Cl. ........ 438/303; 438/289; 438/290; 438/197; 438/301; 257/408

(58) Field of Classification Search .................. 438/291, 438/299, 301, 197, 290, 289, 303; 257/408
See application file for complete search history.

(56) References Cited

U.S. PATENT DOCUMENTS

| 4,838,993 | A  | * | 6/1989  | Aoki et al. ..................... 438/299 |
| 6,274,894 | B1 | * | 8/2001  | Wieczorek et al. ............ 257/192 |
| 6,534,373 | B1 | * | 3/2003  | Yu ................................. 438/372 |
| 6,881,641 | B2 |   | 4/2005  | Wieczorek et al. |
| 7,002,214 | B1 |   | 2/2006  | Boyd et al. |
| 7,601,569 | B2 |   | 10/2009 | Cai et al. |
| 2006/0068555 | A1 | * | 3/2006  | Zhu et al. ....................... 438/303 |
| 2006/0186484 | A1 | * | 8/2006  | Chau et al. ..................... 257/401 |
| 2007/0048907 | A1 | * | 3/2007  | Lee et al. ....................... 438/142 |
| 2007/0155142 | A1 | * | 7/2007  | Jin et al. ........................ 438/514 |
| 2007/0212838 | A1 |   | 9/2007  | Ivanov et al. |
| 2007/0235802 | A1 | * | 10/2007 | Chong et al. .................. 257/346 |
| 2008/0296676 | A1 |   | 12/2008 | Cai et al. |
| 2009/0032880 | A1 | * | 2/2009  | Kawaguchi et al. .......... 257/369 |
| 2009/0108350 | A1 | * | 4/2009  | Cai et al. ....................... 257/347 |
| 2011/0074498 | A1 | * | 3/2011  | Thompson et al. ........... 327/543 |
| 2011/0095343 | A1 | * | 4/2011  | Chan et al. .................... 257/288 |

OTHER PUBLICATIONS

Solomon, P. M., "Universal tunneling behavior in technologically relevant P/N junction diodes", Journal of Applied Physics, vol. 95, No. 10, May 15, 2004, pp. 5800-5812.

* cited by examiner

*Primary Examiner* — Asok Sarkar
*Assistant Examiner* — Dmitriy Yemelyanov
(74) *Attorney, Agent, or Firm* — Michael Le Strange; Roberts, Mlotkowski, Safran & Cole, P.C.

(57) ABSTRACT

A method of forming a semiconductor device includes: forming a channel of a field effect transistor (FET) in a substrate; forming a heavily doped region in the substrate; and forming recesses adjacent the channel and the heavily doped region. The method also includes: forming an undoped or lightly doped intermediate layer in the recesses on exposed portions of the channel and the heavily doped region; and forming source and drain regions on the intermediate layer such that the source and drain regions are spaced apart from the heavily doped region by the intermediate layer.

19 Claims, 11 Drawing Sheets

HIGH PERFORMANCE LOW POWER BULK FET DEVICE AND METHOD OF MANUFACTURE

FIELD OF THE INVENTION

The invention relates to semiconductor structures and methods of manufacture and, more particularly, to a high performance low power bulk field effect transistor (FET) device with reduced gate induced drain leakage (GIDL).

BACKGROUND

As bulk CMOS devices are scaled to the 22 nm node and beyond, a trade-off is emerging between controlling short channel effects (SCE) and threshold voltage (Vt), and reducing gate induced drain leakage (GIDL). High channel doping and abrupt source/drain profiles are used in CMOS design to suppress the short channel effect. For low stand-by power technologies, channel doping is expected to reach $10^{19}/cm^3$ at the 22 nm node. However, the combination of high channel doping and abrupt source/drain profiles disadvantageously gives rise to an exponential increase of GIDL current near the drain junction in the off-state. For example, simulation results show that GIDL current will be orders of magnitude higher (~5 nA/μm) than the off-current target (~30-300 pA/μm) in low-power technologies.

The threshold voltage (Vt) variation due to random dopant number fluctuation in the device body is another limiting factor for bulk CMOS for the 22 nm node and beyond. Conventional devices use halo or pocket doping to create a heavily doped region in the substrate. This heavily doped region helps with the SCE and Vt control, but disadvantageously increases GIDL because the heavily doped region that is formed by halo or pocket doping overlaps or directly contacts the source and drain regions of the FET. Super-steep retro-grade well (SSRW) structures have been used to address the short channel effect control and Vt variability issues by using an undoped channel layer on top of a heavily doped ground plane with a doping concentration on the order of $10^{19}/cm^3$. But SSRW structures are not suitable for low-power technologies, due to the high junction leakage current arising from band-to-band tunneling between a heavily doped ground plane and heavily doped source/drain regions.

Conventional halo design with high channel doping and abrupt junctions results in reduced effective tunneling distance near the drain-to-body P/N junction. FIG. 1 shows data plots 110 that depict an exponential relationship between band to band tunneling (BTBT) current and tunneling distance. Based on the trend in FIG. 1, an exponential rise in GIDL current is projected for device scaling from the 45 nm node to the 22 nm node, as shown in FIG. 2.

Accordingly, there exists a need in the art to overcome the deficiencies and limitations described hereinabove.

SUMMARY

In a first aspect of the invention, there is a method of forming a semiconductor device comprising: forming a channel of a field effect transistor (FET) in a substrate; forming a heavily doped region in the substrate; and forming recesses adjacent the channel and the heavily doped region. The method also includes: forming an undoped or lightly doped intermediate layer in the recesses on exposed portions of the channel and the heavily doped region; and forming source and drain regions on the intermediate layer such that the source and drain regions are spaced apart from the heavily doped region by the intermediate layer.

In another aspect of the invention, there is a method of forming a semiconductor device. The method includes: forming a first layer on a substrate, wherein the first layer has a first dopant concentration; forming a second layer on the first layer, wherein the second layer has a second dopant concentration less than the doping concentration of the first layer; forming a gate of a field effect transistor (FET) on the second layer; and forming a mask on portions of the second layer adjacent the gate. The method also includes removing regions of the first layer and the second layer adjacent the masked portions. The removing exposes surfaces of the substrate, first layer and second layer. The method additionally includes forming a third layer on the exposed surfaces of the substrate, first layer and second layer. A third dopant concentration of the third layer is less than the first dopant concentration. The method also includes forming a source and drain regions on the third layer.

In yet another aspect of the invention, there is a semiconductor structure comprising: a field effect transistor (FET) including a channel in a substrate; a heavily doped region in the substrate; an undoped or lightly doped intermediate layer on the heavily doped region; and source and drain regions of the FET on the intermediate layer. The intermediate layer is between the channel and the source and drain regions. The intermediate layer is also between the heavily doped region and the source and drain regions.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the high-performance, low-power bulk FET device which comprises the structures of the present invention. In still further embodiments, a method in a computer-aided design system is provided for generating a functional design model of the high-performance, low-power bulk FET device. The method comprises generating a functional representation of the suctural elements of the high-performance, low-power bulk FET device.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to a high performance low power bulk field effect transistor (FET) device with reduced gate induced drain leakage (GIDL). In accordance with aspects of the invention, a heavily doped region is formed in the substrate below the channel of the FET but not overlapping or contacting the source/drain regions of the FET. The heavily doped region provides a drain induced barrier lowering (DIBL) stopping layer, for effective short channel effect control. In embodiments, the threshold voltage (Vt) of the device may be set based on a combination of the work function of the metal gate material and the spatial placement of the DIBL stopping layer. The DIBL stopping layer is spatially separated from the source/drain regions by an undoped, or lightly doped, layer so as to minimize the junction leakage and GIDL current. In this manner, implementations of the invention provide structures and methods that provide for controlling SCE and Vt while at the same time reducing GIDL.

In embodiments, as devices are scaled to smaller dimensions, the DIBL stopping layer may be placed closer to the surface, which has the effect of raising the device Vt, which is suitable for low-power technologies. The Vt target in a device made in accordance with aspects of the invention may be achieved by adjusting the metal gate work function, for example towards mid-gap.

Figure 1:
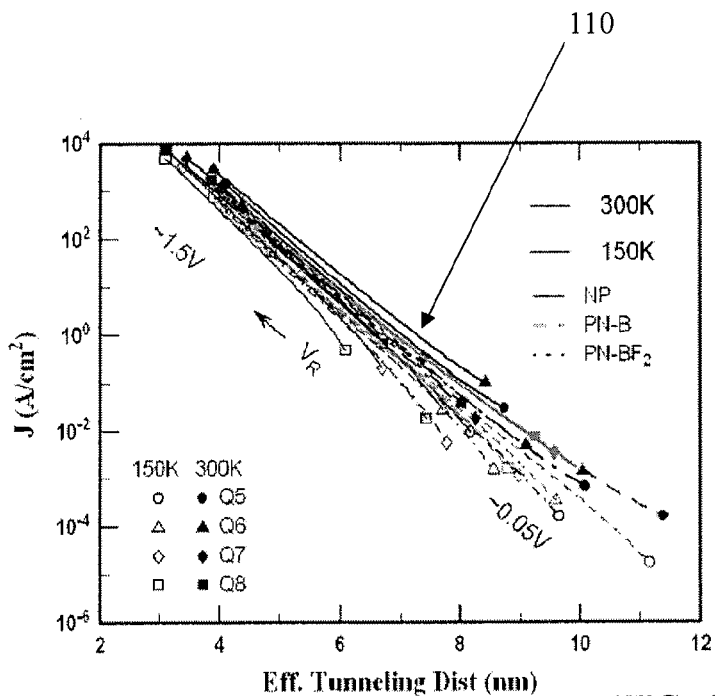
FIG. 1 shows a relationship between band to band tunneling current and effective tunneling distance.
Figure 2:
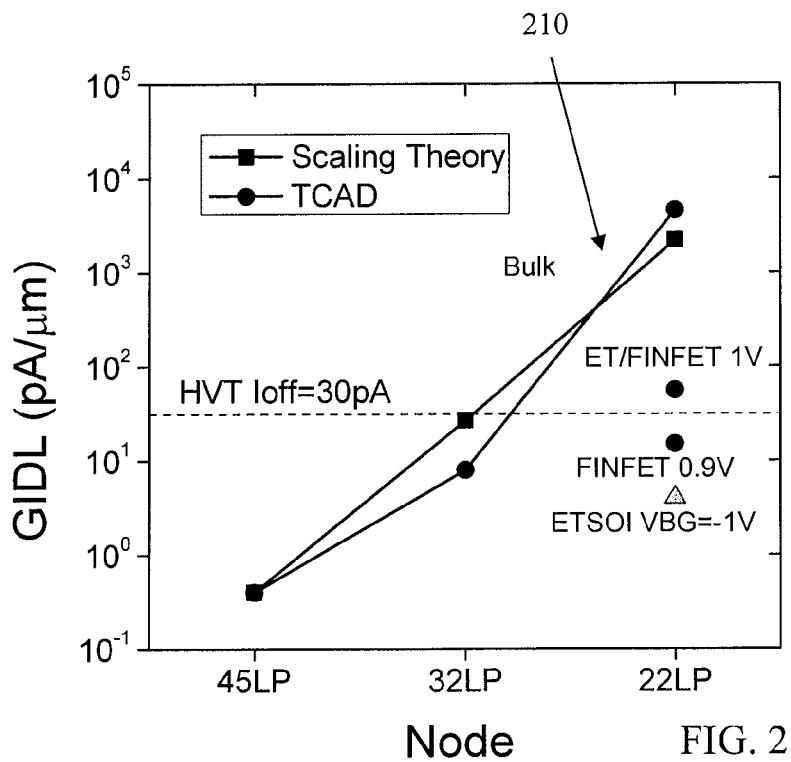
FIG. 2 shows a relationship between gate induced drain leakage and technology node.

FIG. 2 shows a relationship between GIDL current and technology node. Particularly, FIG. 2 shows data plots 210 depicting that GIDL is projected to increase exponentially as technology nodes scale downward.

Figure 3:
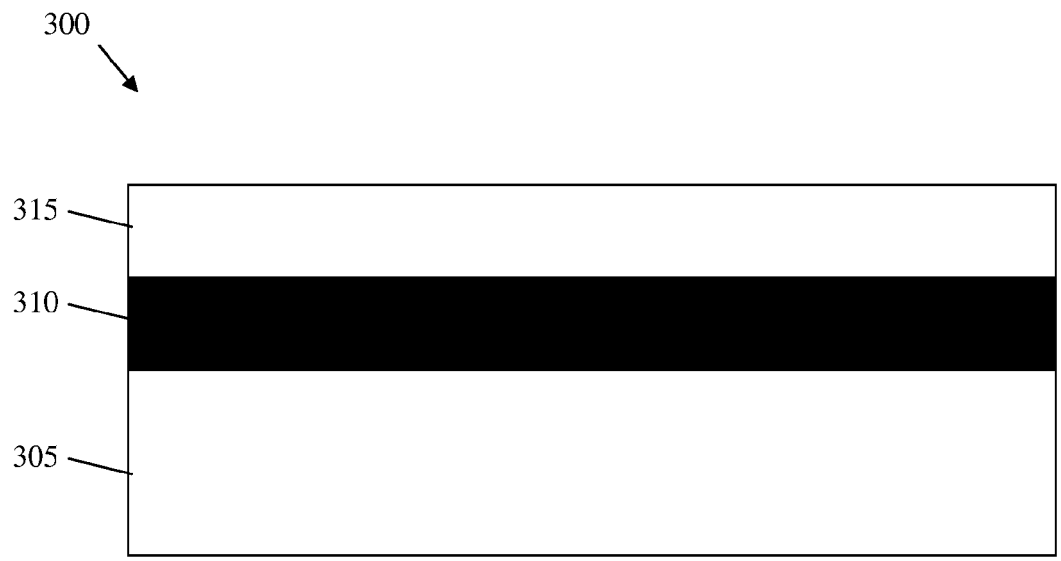
FIGS. 3-12 show structures and fabrication steps in accordance with aspects of the invention.

FIGS. 3-12 show structures and fabrication steps in accordance with aspects of the invention. More specifically, FIG. 3 shows a wafer 300 comprising an undoped or lightly doped substrate 305, a highly doped layer 310 formed on and contacting the substrate 305, and an undoped layer 315 formed on and contacting the highly doped layer 310. The substrate 305 and layers 310 and 315 may be formed using conventional semiconductor processing techniques and materials. For example, the substrate 305 may be composed of any suitable semiconductor material, such as silicon. In embodiments, the substrate is composed of undoped silicon or silicon that is lightly doped with a p-type dopant, such as boron, indium, aluminum, gallium, etc., with a concentration in the range of $10^{15}/cm^3$ to $10^{17}/m^3$ The invention is described herein with respect to p-type dopants used in the fabrication of an NFET device, e.g., NMOSFET. The scope of the invention is not limited to NFET devices, however, and implementations of the invention may equally include a PFET device having n-type doped substrate and a CMOSFET having both PFET and NFET devices over n-type doped regions and p-type doped regions respectively.

The highly doped layer 310 may be composed of silicon that is doped with a p-type dopant having a concentration in the range of about $10^{18}/cm^3$ to $10^{19}/cm^3$. The highly doped layer 310 may be epitaxially grown and doped in situ, or may be a portion of the substrate that is doped using a conventional ion-implantation process. In embodiments, the highly doped layer 310 has a thickness (e.g., vertical depth) of about 10 nm to about 100 nm, although the invention is not limited to this thickness and any suitable thickness may be used within the scope of the invention.

The undoped layer 315 may be composed of undoped silicon that is epitaxially grown on the highly doped layer 310. In embodiments, the undoped layer 315 has a thickness (e.g., vertical depth) of about 5 nm to about 20 nm, although the invention is not limited to this thickness and any suitable thickness may be used within the scope of the invention. As described in greater detail here, a portion of layer 315 forms a channel region of the FET.

Figure 4:
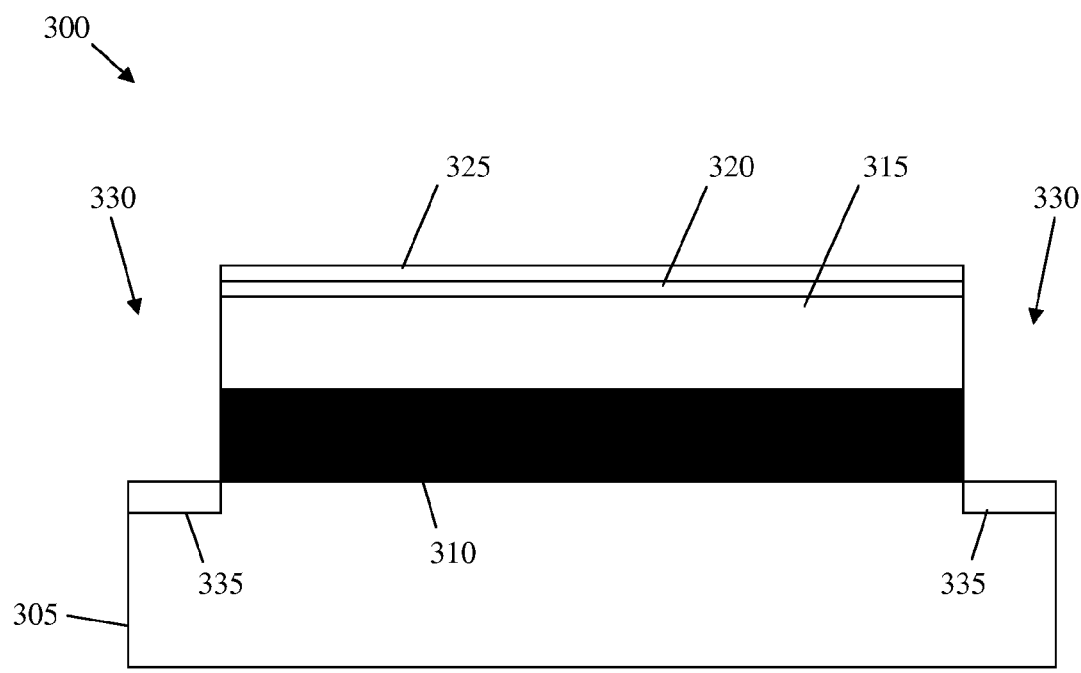

FIG. 4 shows a portion of the wafer 300 after a number of conventional semiconductor fabrication processing steps have been performed, including: forming a layer of pad oxide 320 on the upper surface of the undoped layer 315; forming a layer of pad nitride 325 on the pad oxide 320; and patterning the pad oxide 320 and pad nitride 325 to form shallow trench isolation (STI) trenches 330 in the wafer 300. For example, the pad oxide 320 and pad nitride 325 may comprise any suitable oxide and nitride, respectively, such as $SiO_2$ and $Si_3N_4$, and may be formed using any desired fabrication technique, such as: thermal oxidation, chemical oxidation, thermal nitridation, atomic layer deposition (ALD), molecular layer deposition (MLD), chemical vapor deposition (CVD), low-pressure chemical vapor deposition (LPCVD), plasma enhanced chemical vapor deposition (PECVD), etc.

In embodiments, pad oxide 320 and pad nitride 325 are patterned using conventional techniques, such as, for example, lithography and etching. The patterned pad oxide 320 and pad nitride 325 layers may then be used as a mask for forming the STI trenches 330, which may be formed by etching portions of the undoped layer 315, heavily doped layer 310, and substrate 305 using conventional etching techniques.

Still referring to FIG. 4, the base of the STI trenches 330 may optionally be doped for enhanced isolation. For example, a shallow field implantation process may be performed in which boron ions are implanted into region 335 at an energy of about 2 keV and a concentration of about $5\times10^{14}/cm^3$. Alternatively, the field implantation process may comprise implanting borondifluoride ($BF_2$) ions into the region 335 at an energy of about 7 keV and a concentration of about $5\times10^{14}/cm^3$. Implantation of ions into the region 335 is optional.

Figure 5:
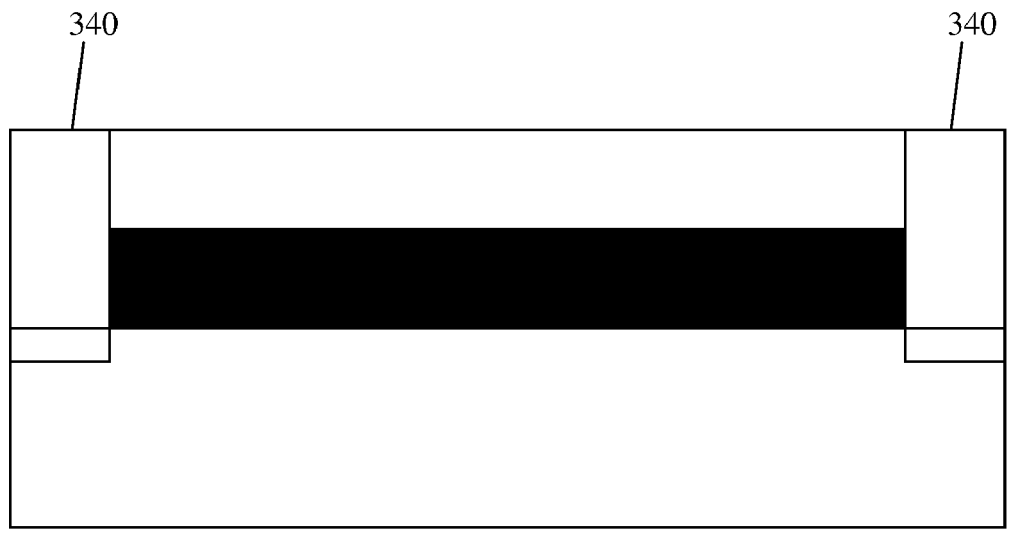

FIG. 5 shows the wafer after filling the STI trenches 330 with isolation material 340 and removing the pad oxide 320 and pad nitride 325 layers. In embodiments, the STI trenches 330 are filled with STI material 340, such as $SiO_2$, using conventional techniques, such as thermal oxidation, chemical oxidation, ALD, MLD, CVD, LPCVD, PECVD, etc. After forming the STI material 340, the structure may be subjected to a chemical mechanical polish (CMP) process.

Figure 6:
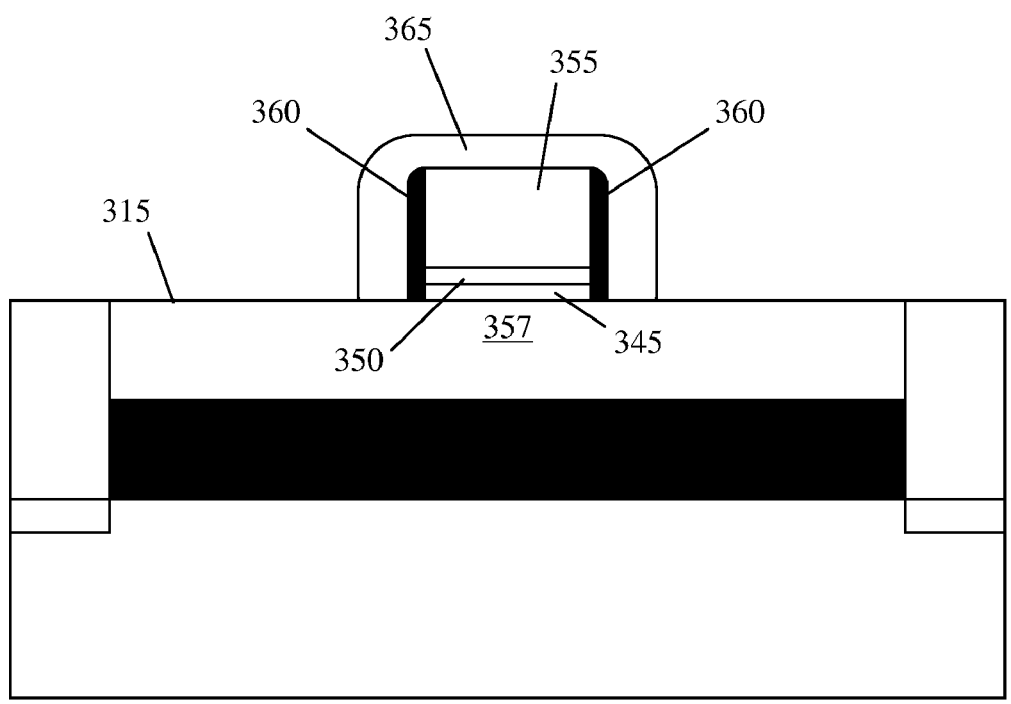

As shown in FIG. 6, in accordance with aspects of the invention, a gate stack comprising gate dielectric 345, gate metal 350, and gate electrode 355 is formed over the undoped layer 315. In this manner, the portion of layer 315 underneath the gate stack constitutes a channel 357 of the FET. First spacers 360 are formed on sidewalls of the gate stack, and a second spacer 365 is formed over the exposed top and side surfaces of the gate stack and first spacers 360. The gate stack, first spacers 360, and second spacers 365 are formed using conventional semiconductor processing techniques.

In embodiments, the gate dielectric 345 comprises a high-k dielectric such as hafnium oxide formed using chemical vapor deposition (CVD). However, the invention is not limited to the use of hafnium oxide, and the gate dielectric 345 may be composed of other materials including but not limited to: silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as lanthanum, aluminum, etc.

Furthermore, although CVD is described for forming the gate dielectric 345, the gate dielectric 345 may be formed by any suitable process such as, for example: thermal oxidation, chemical oxidation, thermal nitridation, atomic layer deposition (ALD), molecular layer deposition (MLD), chemical vapor deposition (CVD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), in-situ radical assisted deposition, high temperature oxide deposition (HTO), low temperature oxide deposition (LTO), ozone/TEOS deposition, limited reaction processing CVD (LRPCVD), ultrahigh vacuum chemical vapor deposition (UHVCVD), metalorganic chemical vapor deposition (MOCVD), molecular beam epitaxy (MBE), physical vapor deposition, sputtering, plating, evaporation, spin-on-coating, ion beam deposition, electron beam deposition, laser assisted deposition, chemical solution deposition, or any combination of the aforementioned.

Still referring to FIG. 6, the gate metal 350 is formed on the gate dielectric 345. In embodiments, the gate metal 350 comprises titanium nitride (TiN) deposited by CVD. However, the invention is not limited to the use of titanium nitride, and the gate metal 350 may be composed of other materials including but not limited to: polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive material may further comprise dopants that are incorporated during or after deposition. Moreover, the gate metal 350 is not limited to formation using CVD, but rather any suitable process, such as those described above, may be used to form the gate metal 350.

The gate electrode 355 may be composed of polysilicon or other suitable gate electrode material. In embodiments, the gate stack is formed by depositing respective layers of the gate dielectric 345, gate metal 350, and gate electrode 355 material on the undoped silicon layer 315, forming a gate mask (not shown) over the layers, patterning the gate mask to define the gate stack, etching the layers of the gate dielectric 345, gate metal 350, and gate electrode 355 material to form gate stack, and removing the gate mask.

The first spacers 360 and second spacer 365 may be formed using conventional semiconductor fabrication techniques. In embodiments, the first spacers 360 and second spacer 365 are composed of different materials, such as nitride and oxide, respectively, for reasons described in greater detail herein. In embodiments, the first spacers 360 are composed of $Si_3N_4$ and have a width, e.g., transverse dimension, of about 3 nm to 15 nm. In further embodiments, the second spacer 365 is composed of $SiO_2$ and has a width of about 3 nm to 50 nm.

Figure 7:
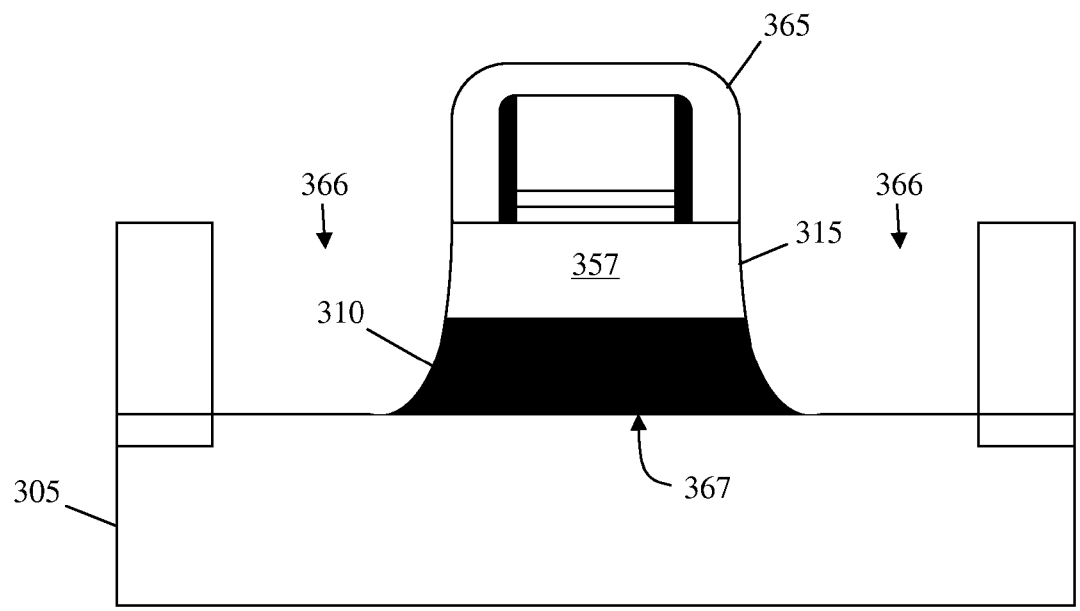

In accordance with aspects of the invention, as depicted in FIG. 7, portions of the undoped layer 315 and heavily doped layer 310 are removed, thereby forming recesses 366 adjacent the channel 357 and a heavily doped region 367. In embodiments, the portions of the undoped layer 315 and heavily doped layer 310 are removed using an isotropic silicon etch process, such as a reactive ion etch (RIE). The second spacer 365 masks a region of the undoped layer 315 and heavily doped layer 310 and prevents this region from being removed during the etch. In embodiments, the etch process continues into the substrate 305, e.g., is over-etched, to ensure that the entirety of the heavily doped layer 310 is removed within the etch area.

Figure 8:
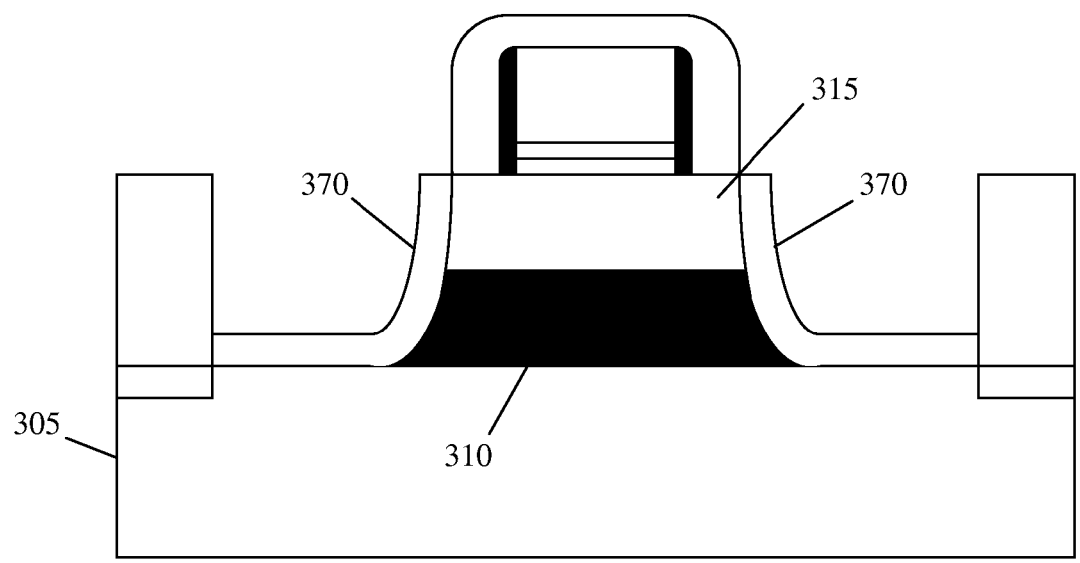

As depicted in FIG. 8, an intermediate layer 370 of undoped or lightly doped silicon is epitaxially grown on exposed surfaces of the substrate 305, heavily doped layer 310, and undoped layer 315. In embodiments, the intermediate layer 370 is grown to a thickness of about 2 nm to about 10 nm, although the invention is not limited to this thickness and other thicknesses may be used within the scope of the invention. The thickness of the intermediate layer 370 may be controlled by controlling the timing of the growth process. In embodiments, the intermediate layer 370 is undoped or lightly doped Si having a p-type dopant concentration of about $10^{15}/cm^3$.

Figure 9:
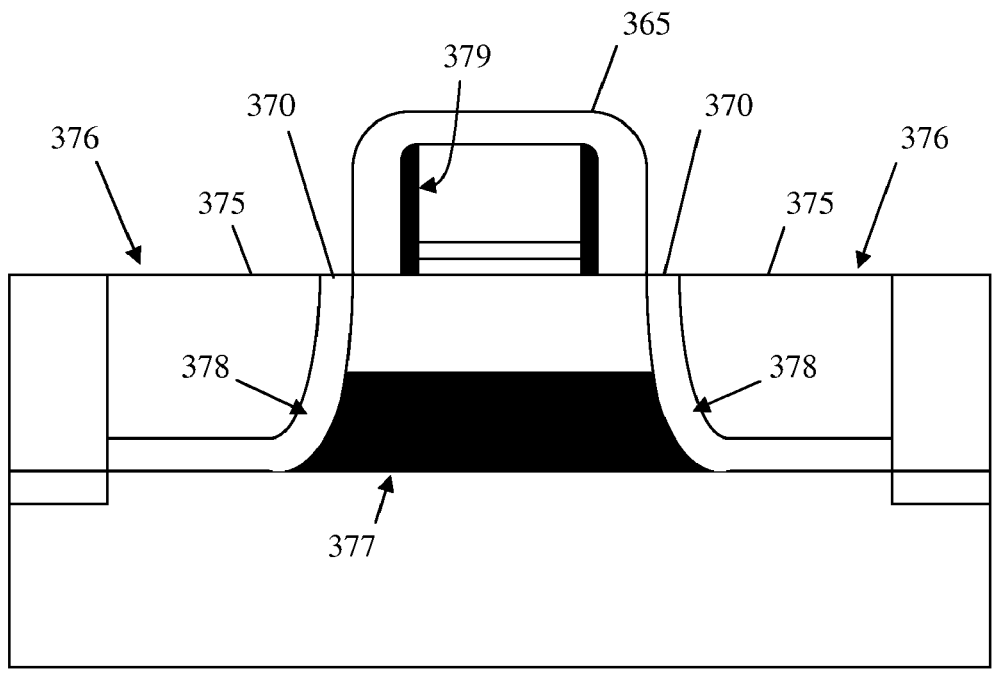

As shown in FIG. 9, a source/drain layer 375 of heavily doped silicon is epitaxially grown on the intermediate layer 370. In embodiments, the source/drain layer 375 comprises epitaxially grown silicon that is in situ doped with N+ type dopant, such as arsenic, phosphorus, etc., having a concentration of about $10^{20}/cm^3$ to about $10^{21}/cm^3$. The source/drain layer 375 forms source and drain regions 376 of the FET.

In accordance with aspects of the invention, as depicted in FIG. 9, the remainder of the heavily doped layer 315 under the gate stack constitutes a DIBL stopping layer (also called a buried well) 377 underneath the channel of the FET, and the material of the source/drain layer 375 forms source and drain regions 376 of the FET. The material of the intermediate layer 370 forms a gap region 378 between the DIBL stopping layer 377 and the source and drain regions 376, such that the DIBL stopping layer 377 does not overlap and/or directly contact the source and drain regions 376. In embodiments, the gap region 378 between the DIBL stopping layer 377 and the source and drain regions 376 is located outside of the gate edge 379 (e.g., laterally spaced apart from the gate edge), due to the width of the second spacer 365. In further embodiments, the gap region 378 is much smaller than the channel length and is buried between the deep source and drain regions 376 and the buried well 377. Such a gap region 378 is unattainable using conventional halo and pocket implants, and this is why conventional halo and pocket implants result in the heavily doped well region overlapping or directly contacting the source and drain regions. For example, there is no buried well in a conventional halo device. Instead, the entire channel and body of the FET is heavily doped by the halo (e.g., pocket) implant and the heavily doped body region necessarily contacts the heavily doped source and drain regions.

Figure 10:
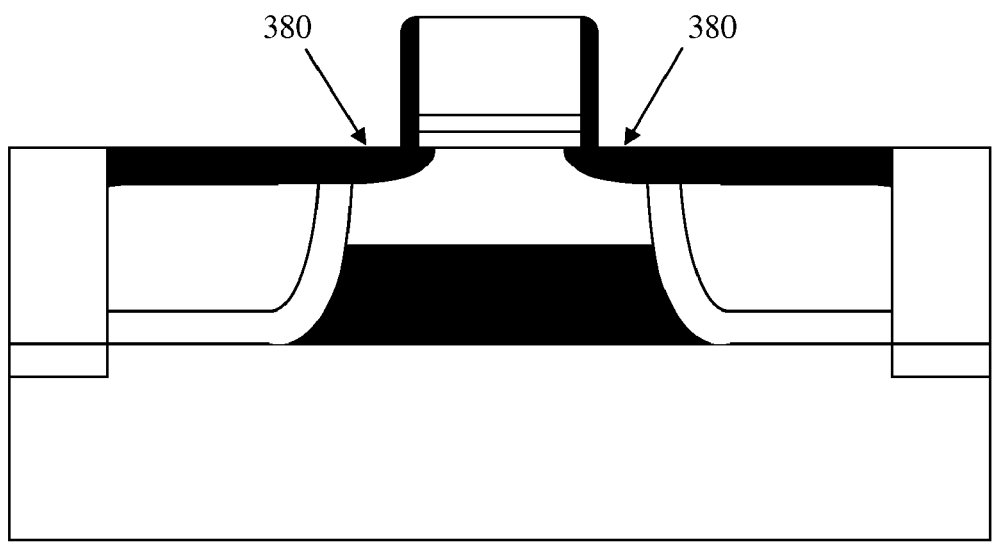

As depicted in FIG. 10, the second spacer (365) is removed using conventional oxide stripping techniques. Ultra shallow junction (USJ) regions 380 are formed by implanting n-type dopant, such as arsenic, phosphorus, etc., at a dose of $10^{14}/cm^2$ to about $10^{15}/cm^2$ for a concentration of about $10^{19}/cm^3$ to about $10^{20}/cm^3$ in the USJ region. The ion implant to form the USJ regions 380 may be performed at a substantially vertical angle or at non-zero angle relative to vertical, depending on a desired extent of lateral diffusion of the implanted ions underneath the gate stack. Moreover, the implantation process may be controlled to control the thickness, e.g., depth, of the USJ regions 380 to any desired depth in order to tune the device characteristics. In embodiments, the depth of the USJ regions 380 is selected such that a gap remains between the DIBL stopping layer and the USJ regions 380.

Figure 11:
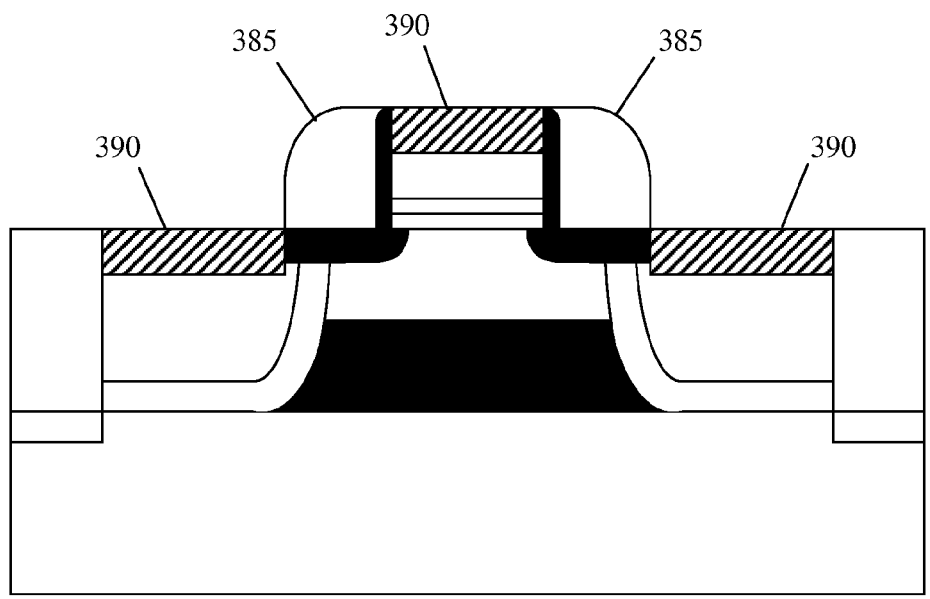
Figure 12:
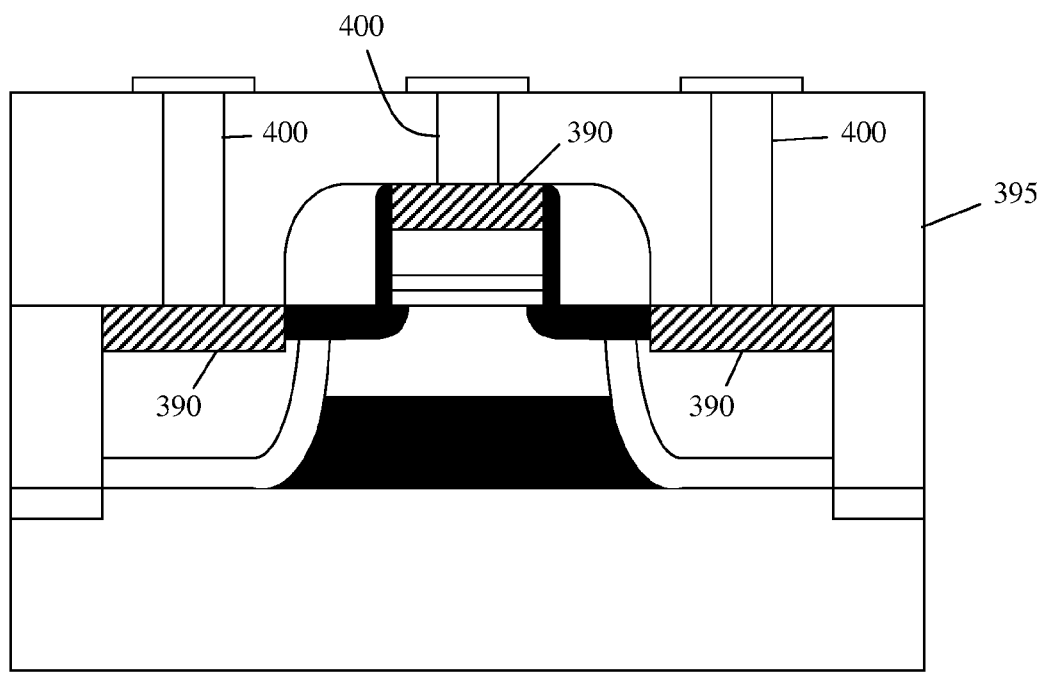

As depicted in FIG. 11, silicide spacers 385 and silicide regions 390 are formed using conventional material and processing techniques. In embodiments, the silicide spacers mask portion of the USJ regions 380 adjacent the gate, and the silicide regions 390 are formed on exposed portions of the source and drain regions and the gate. As depicted in FIG. 12, an interlevel dielectric (ILD) layer 395 is formed over the device, and contacts 400 are formed in the ILD layer 395 to provide electrical pathways to the silicide regions 390 associated with the source and drain regions and the gate.

Figure 13:
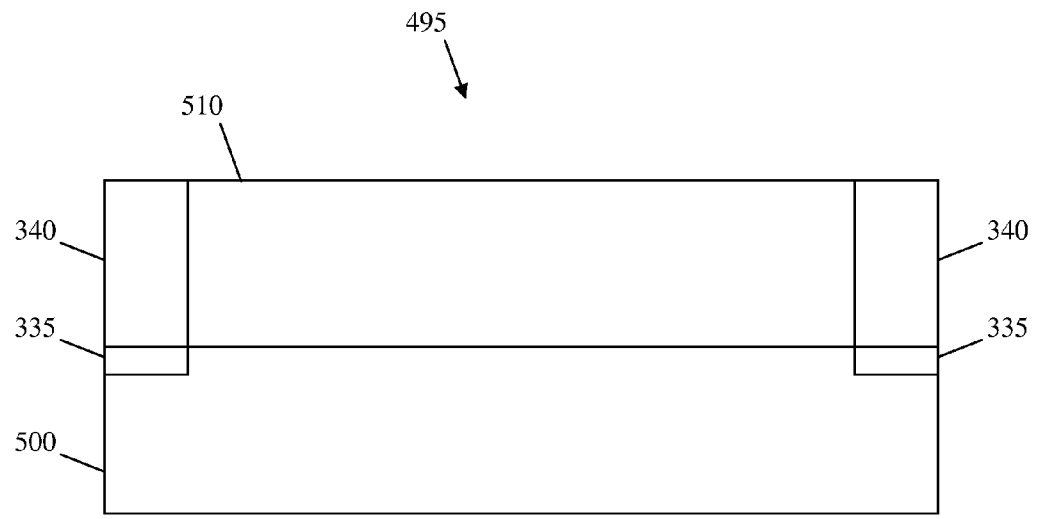
FIGS. 13-20 show additional structures and fabrication steps in accordance with further aspects of the invention.

FIGS. 13-20 show additional structures and fabrication steps in accordance with further aspects of the invention. In particular, FIGS. 13-20 depict an embodiment associated with a halo implanted structure, rather than a buried well structure as already described above with respect to FIGS. 3-12. With reference to FIG. 13, there is a substrate 495 comprising a first region 500 and a second region 510 formed on the first region 500. In embodiments, the substrate 495 may be a semiconductor on insulator (SOI) wafer in which the first region 500 is a buried insulator layer and the second region 510 is an active semiconductor layer. Alternatively, the substrate 495 may comprise a bulk semiconductor substrate in which the first region 500 is an undoped or lightly doped portion of the substrate and the second region 510 is an undoped or lightly doped portion of the substrate. The substrate 495 may comprise shallow trench isolation regions 340 and may optionally include field implantation regions 335 similar to those described above with respect to FIGS. 4 and 5. The substrate 495 depicted in FIG. 13, and the structures contained therein, may be formed using conventional semiconductor fabrication processes and materials.

Figure 14:
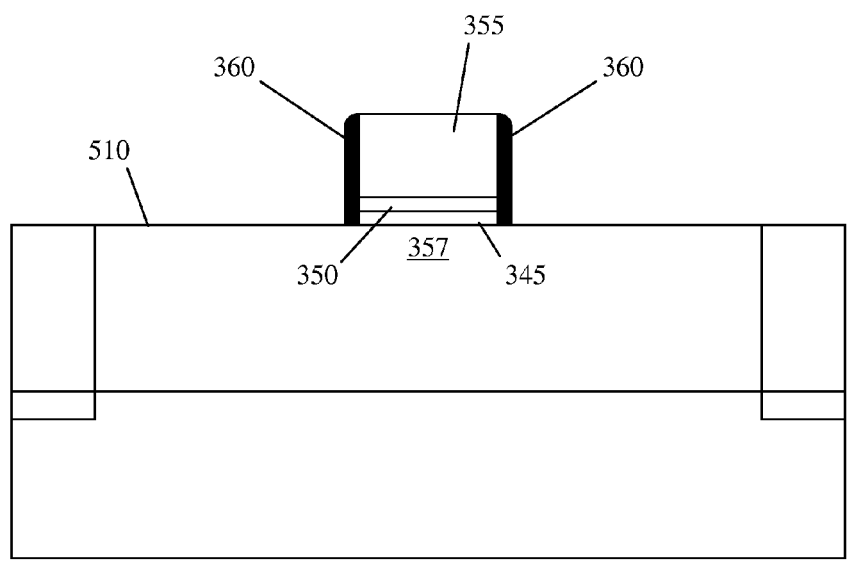

FIG. 14 shows the formation of a gate stack on the second region 510, the gate stack comprising a gate dielectric 345, gate metal 350, and gate conductor 355. First spacers 360 may also be formed on the gate stack. A channel region 357 is located below the gate stack. The gate stack and first spacers 360 may be formed using conventional semiconductor fabrication processes and materials, as described, for example, with respect to FIG. 6.

Figure 15:
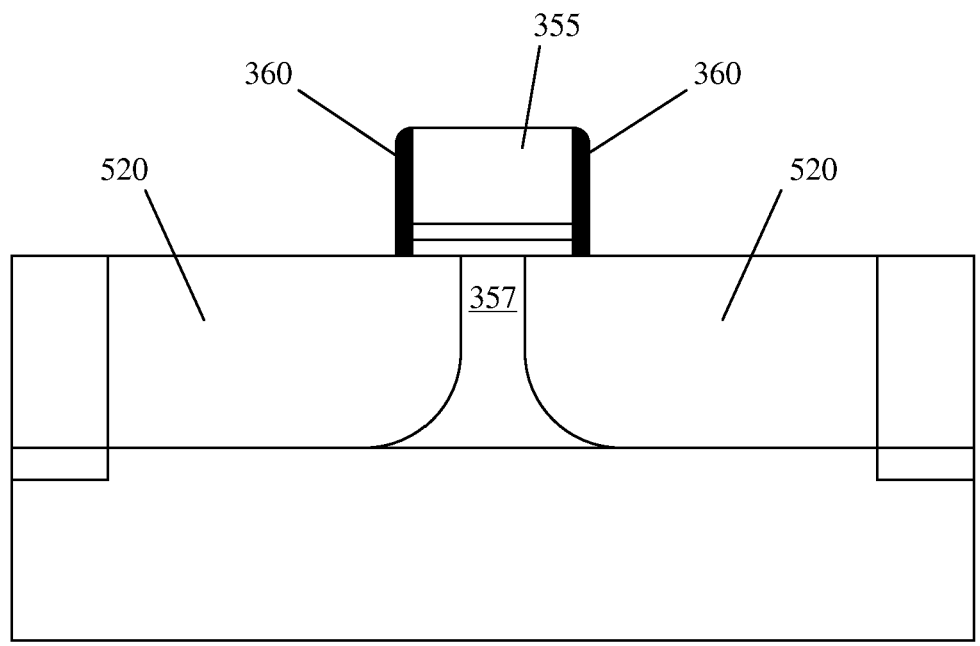

FIG. 15 shows the structure after a halo implant process (also referred to as a pocket implant) has been used to create halo doped regions 520. In embodiments, a halo dopant is implanted at a non-zero tilt angle relative to vertical from both the left and right sides of the gate stack. In embodiments, the halo doped regions 520 constitute a heavily doped region and may overlap a portion, or all, of the channel 357. For long channel devices, the halo implant provides less dopant at the center of the channel 357 since the dopant is blocked by the gate and cannot reach the central portion of the channel during the implant process. On the other hand, for short channel devices, the halo implant may result in dopant being implanted into an entirety of the channel 357. For both long channel and short channel devices, the halo dopant will migrate toward the center of the channel 357 during one or more thermal anneal steps. In embodiments, the halo dopant is a p-type dopant such as boron, and is implanted at an energy of about 3-10 keV and a dose of $10^{13}$ to $10^{14}/cm^3$ with a tilt angle of 20 to 30 degrees to achieve a concentration of about $10^{18}$ to $10^{19}/cm^3$ in the halo doped regions 520. However, the invention is not limited to this illustrative example, and any suitable dopant may be implanted at any desired energy and concentration. Also, the tilt angle of the halo implant may be tailored to the size of the channel 357.

Figure 16:
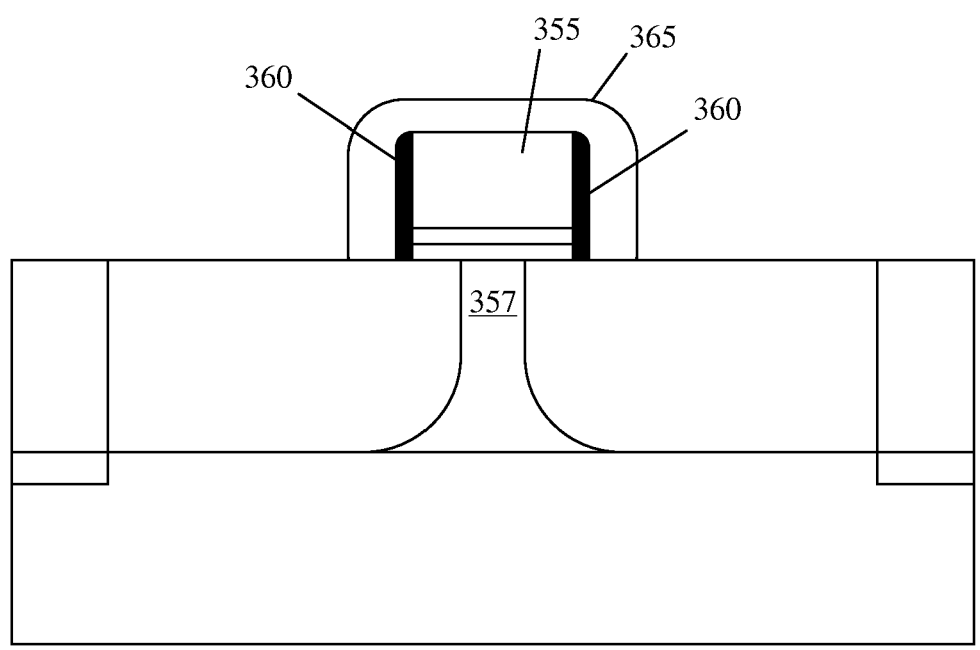
Figure 17:
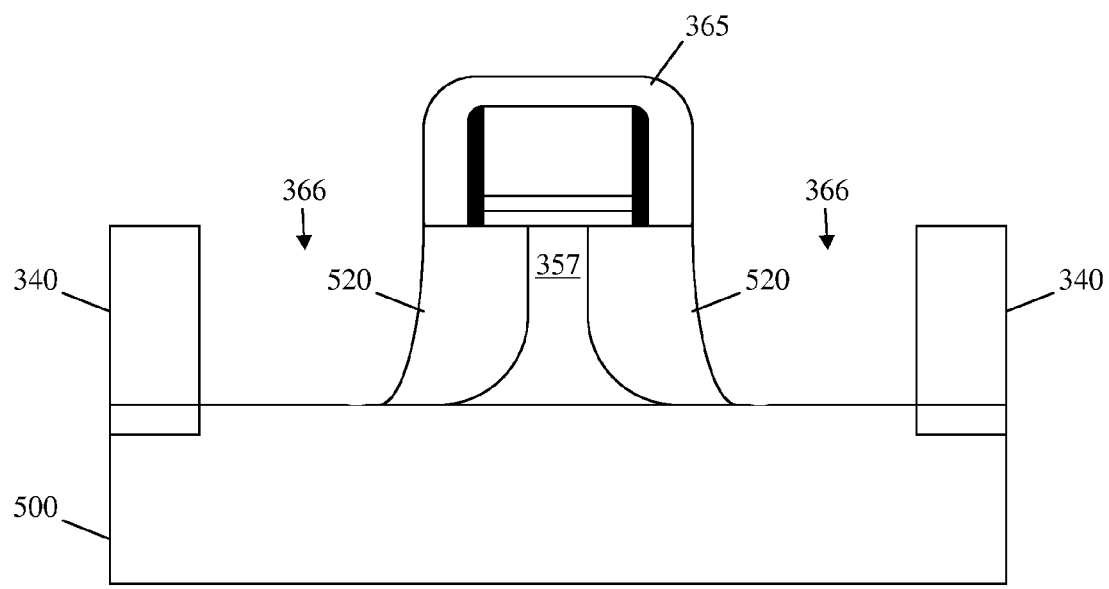

FIG. 16 shows the formation of a second spacer 365 in accordance with aspects of the invention. The second spacer 365 may be formed in a manner similar to that described above with respect to FIG. 6. After formation of the halo doped regions 520 and second spacer 365, the process may continue in a manner similar to that described above with respect to FIGS. 7-12. For example, FIG. 17 depicts the formation of recesses 366 by removing material adjacent the halo doped regions 320 in the channel 357 in accordance with aspects of the invention. In embodiments, portions of the halo doped regions 520 are removed using an isotropic etch process, such as a reactive ion etch (RIE), similar to that described above with respect to FIG. 7. As depicted in FIG. 17, the STI 340 and second spacer 365 define the etch region.

Figure 18:
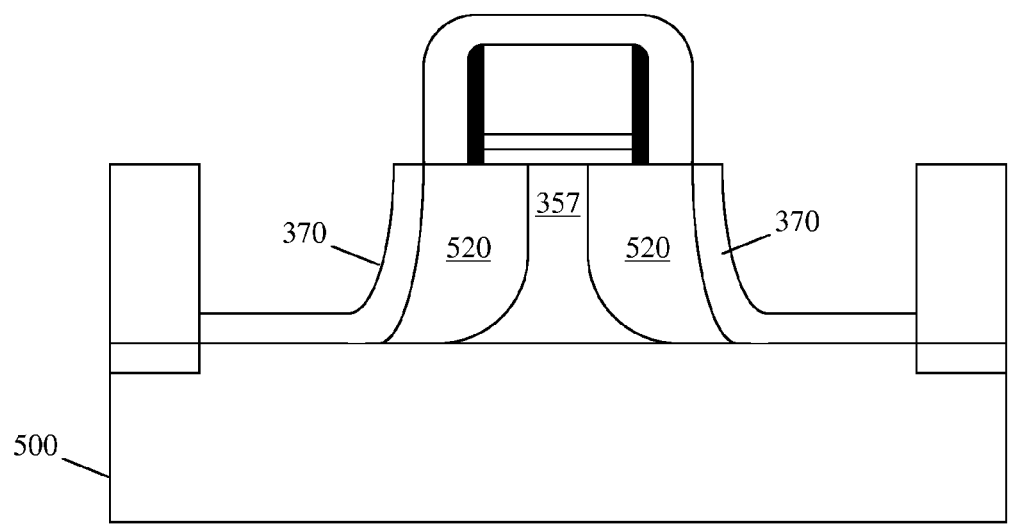
Figure 19:
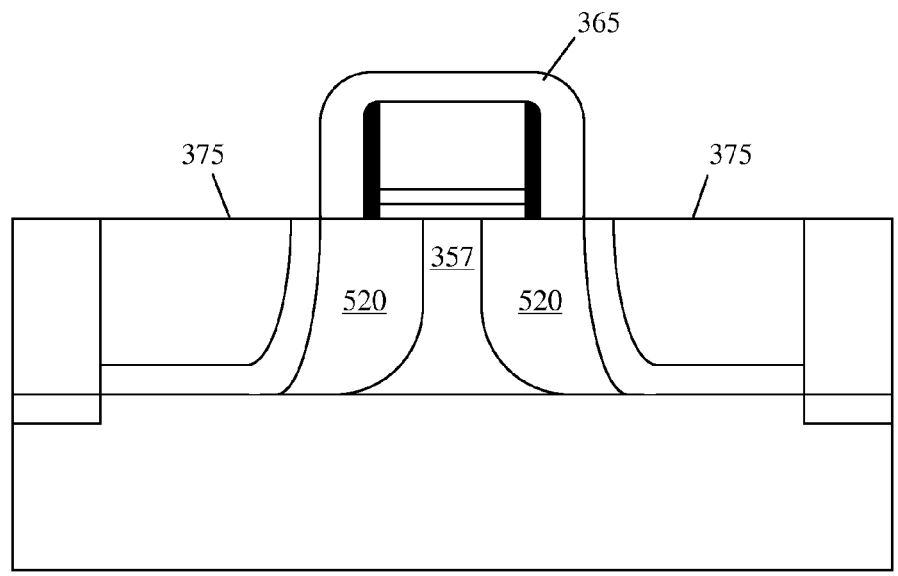
Figure 20:
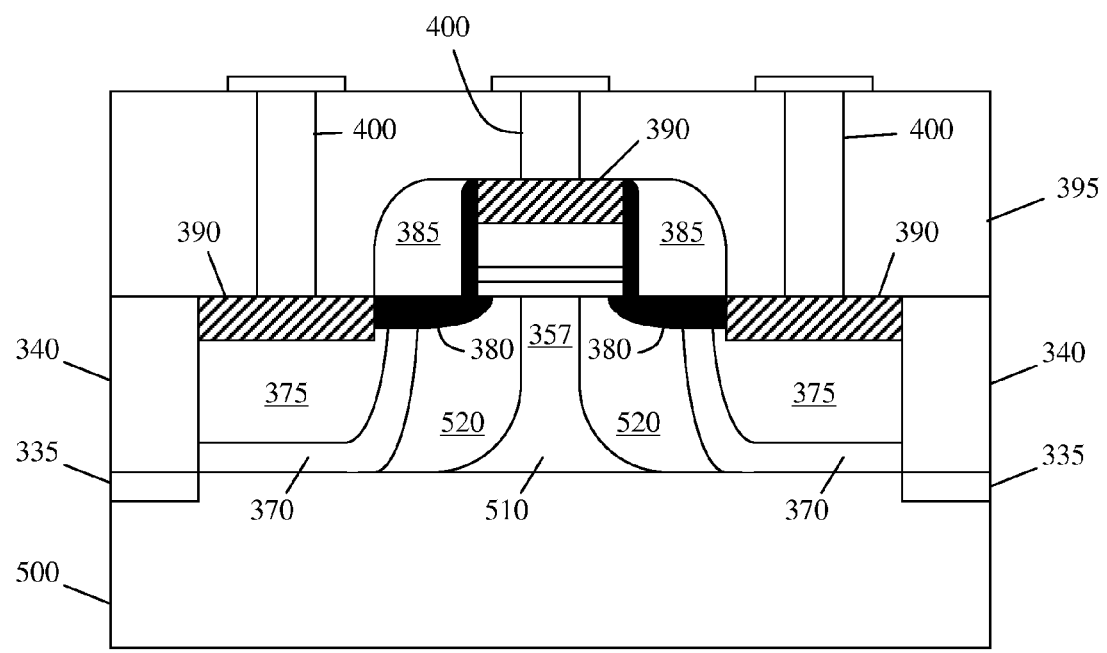

As depicted in FIG. 18, an intermediate layer 370 of undoped or lightly doped silicon is epitaxially grown on exposed surfaces of the first region 500 and also on exposed surfaces of the channel 357 and/or the halo doped regions 520. As shown in FIG. 19, a source/drain layer 375 of heavily doped silicon is epitaxially grown on the intermediate layer 370. As depicted in FIG. 20, the second spacer 365 is removed, USJ regions 380 are formed, silicide spacers 385 and silicide regions 390 are formed, an ILD layer 395 is formed, and contacts 400 are formed in the ILD layer 395. The steps of FIGS. 18-20 may be performed in a manner similar to those described above with respect to FIGS. 8-12.

In accordance with aspects of the invention, the intermediate layer (e.g., intermediate layer 370) increases band-to-band tunneling distance and reduces GIDL for both: (i) the buried well structure (also called super-steep retrograde well (SSRW) structure) depicted in FIGS. 3-12 and (ii) the halo structure depicted in FIGS. 13-20. Moreover, in accordance with aspects of the invention, the buried well structure also provides Vt variation control due to lack of dopants in the surface channel region.

Figure 21:
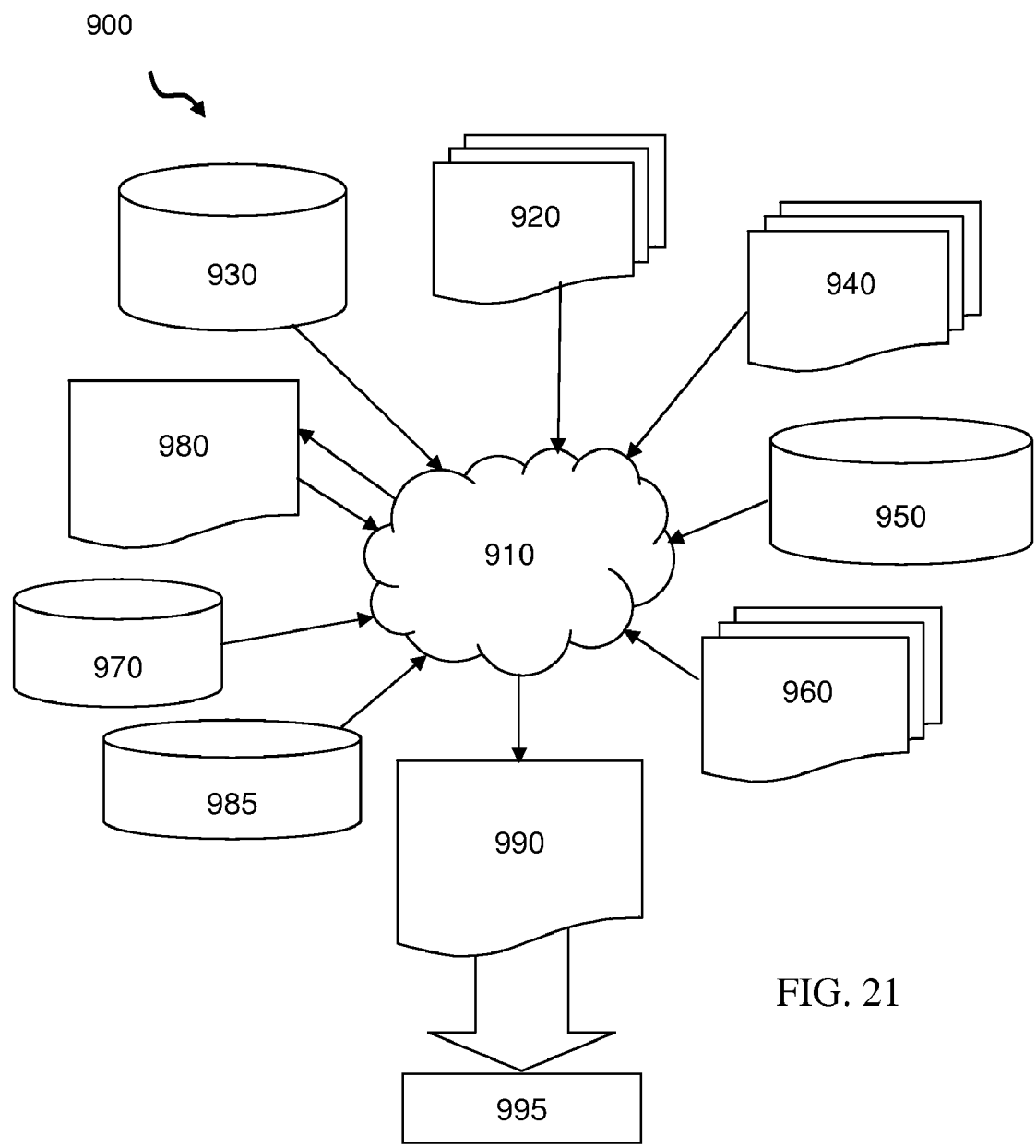
FIG. 21 is a flow diagram of a design process used in semiconductor design, manufacture, and/or test.

FIG. 21 is a flow diagram of a design process used in semiconductor design, manufacture, and/or test. FIG. 21 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 3-20. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 21 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 3-20. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 3-20 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 3-20. In one embodiment, design structure 990 may comprise a compiled, executable HDL simulation model that functionally simulates the devices shown in FIGS. 3-20.

Design structure 990 may also employ a data format used for the exchange of layout data of integrated circuits and/or symbolic data format (e.g. information stored in a GDSII (GDS2), GLI, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 3-20. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/ or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method of forming a semiconductor device, comprising:
    forming a heavily doped region in a substrate;
    forming an undoped silicon layer over the heavily doped region;
    forming a gate of a field effect transistor (FET) on the undoped silicon layer, wherein a channel of the FET is in the undoped silicon layer, and wherein the gate comprises a gate stack including a gate dielectric formed on the undoped silicon layer and a gate electrode formed over the gate dielectric;
    forming first spacers composed of nitride on sidewalls of the gate stack;
    forming a second spacer composed of oxide on an exposed top surface of the gate electrode, on side surfaces of the first spacers, and on a portion of the undoped silicon layer;
    forming recesses adjacent the channel and the heavily doped region, wherein the forming the recesses comprises etching the undoped silicon layer and the heavily doped region while masking portions of the undoped silicon layer and the top surface of the gate electrode with the second spacer, and wherein sidewalk of the recesses are aligned with sidewalls of the second spacer;
    forming an undoped or lightly doped intermediate layer in the recesses on exposed portions of the channel and the heavily doped region; and
    forming source and drain regions on the intermediate layer such that the source and drain regions are spaced apart from the heavily doped region by the intermediate layer.

2. The method of claim 1, wherein:
    the forming the heavily doped region comprises forming a heavily doped well in the substrate; and
    the undoped silicon layer containing the channel is formed on the heavily doped well.

3. The method of claim 1, wherein:
    the forming the intermediate layer comprises epitaxially growing the intermediate layer; and
    the forming the source and drain regions comprises expitaxially growing the source and drain regions on the intermediate layer.

4. The method of claim 1, wherein the intermediate layer reduces gate induced drain leakage by forming a gap region of about 2 nm to about 10 nm between the heavily doped region and the source and drain regions.

5. The method of claim 2, further comprising:
    removing the second spacer after the forming source and drain regions;
    forming ultra shallow junction (USJ) extension regions under edges of the gate after the removing the second spacer, wherein the heavily doped well sits under the gate below the USJ extension regions.

6. The method of claim 1, wherein the gate stack further comprises
    a gate metal formed on the gate dielectric
    with the gate electrode being formed on the gate metal.

7. The method of claim 1, further comprising:
    after the forming the source and drain regions, removing the second spacer from the top surface of the gate electrode, the side surfaces of the first spacers, and the portion of the undoped silicon layer while leaving the first spacers on the sidewalls of the gate stack;
    forming ultra shallow junction (USJ) extension regions in the undoped silicon layer under edges of the gate by implanting ions to a depth less than a thickness of the undoped silicon layer.

8. The method of claim 7, further comprising:
    forming silicide spacers on sidewalls of the first spacers, wherein the silicide spacers mask portions of the USJ extension regions adjacent the gate; and
    after the forming the silicide spacers, forming a first silicide region at an exposed portion of the gate electrode and forming second silicide regions at the source and drain regions wherein the second silicide regions extend deeper than the USJ extension regions and into the source and drain regions.

9. The method of claim 1, further comprising:
    forming isolation trenches in the undoped silicon layer and the heavily doped region;
    doping portions of the substrate at bases of the isolation trenches using a field implantation process; and
    filling the isolation trenches with isolation material,
    wherein the gate is formed between the isolation trenches.

10. A method of forming a semiconductor device, comprising:
    forming a first layer on a substrate, wherein the first layer has a first dopant concentration;
    forming a second layer on the first layer, wherein the second layer has a second dopant concentration less than the doping concentration of the first layer;
    forming a gate of a field effect transistor (FET) on the second layer;
    forming first spacers composed of nitride on sidewalls of the gate;
    forming a second spacer composed of oxide on portions of the second layer adjacent the gate, on an exposed top surface of the gate, and on the first spacers;
    removing regions of the first layer and the second layer that are unmasked by the second spacer, wherein the removing exposes surfaces of the substrate, first layer and second layer;
    forming a third layer on the exposed surfaces of the substrate, first layer and second layer, wherein a third dopant concentration of the third layer is less than the first dopant concentration;
    forming a source and drain regions on the third layer;
    removing the second spacer from the portions of the second layer adjacent the gate, the top surface of the gate, and the first spacers, wherein the removing the second spacer is performed after the forming the source and drain regions; and forming extension regions in the second layer under edges of the gate after the removing the second spacer.

11. The method of claim 10, wherein the forming the extension regions comprises implanting ions to a depth less than a thickness of the second layer.

12. The method of claim 10, wherein the forming the third layer comprises epitaxially growing the third layer.

13. The method of claim 10, wherein the forming the source and drain regions comprises epitaxially growing semiconductor material on the third layer.

14. The method of claim 10, wherein:
a channel of the FET is comprised in a remaining portion of the second layer after the removing;
a deep well is comprised in a remaining portion of the first layer after the removing; and
the third layer provides a gap region between the deep well and the source and drain regions.

15. The method of claim 10, wherein:
the second layer is an undoped silicon layer; and
a channel of the FET is in the undoped silicon layer.

16. The method of claim 15, wherein a top surface of the source and drain regions is at a same level as a top surface of the undoped silicon layer.

17. The method of claim 10, wherein the third dopant concentration is less than the first dopant concentration by at least three orders of magnitude.

18. The method of claim 10, wherein:
the first layer and the third layer comprise p-type dopant;
the source and drain regions comprise n-type dopant;
the substrate is undoped or comprises p-type dopant; and
the second layer is undoped or comprises p-type dopant.

19. The method of claim 10, wherein the removing regions of the first layer and the second layer that are unmasked by the second spacer forms recesses having sidewalls that are aligned with sidewalls of the second spacer.

* * * * *